(12) United States Patent
Tempelman et al.

(10) Patent No.: US 7,256,355 B2
(45) Date of Patent: Aug. 14, 2007

(54) COMPONENT ASSEMBLY CUSHIONING DEVICE FOR MOBILE DEVICES

(75) Inventors: Herrebertus Tempelman, Princeton (CA); Robert W. Phillips, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 10/890,325

(22) Filed: Jul. 14, 2004

(65) Prior Publication Data

US 2005/0011659 A1 Jan. 20, 2005

(30) Foreign Application Priority Data

Jul. 14, 2003 (GB) ................. 0316451.4

(51) Int. Cl.
*B60B 25/00* (2006.01)
(52) U.S. Cl. ............. 174/350; 174/351; 174/370; 174/371; 174/373; 174/353; 174/387
(58) Field of Classification Search ........... 174/52.1, 174/35 R, 35 GC, 350, 351, 370, 371, 373, 174/353, 387
See application file for complete search history.

(56) References Cited

U.S. PATENT DOCUMENTS

| | | | |
|---|---|---|---|
| 5,117,073 A | 5/1992 | Mischenko et al. | |
| 5,548,430 A | 8/1996 | Kuo et al. | |
| 6,144,552 A * | 11/2000 | Whitcher et al. | 361/681 |
| 6,177,971 B1 | 1/2001 | Jung et al. | |
| 6,222,121 B1 | 4/2001 | Cheng | |
| 6,483,719 B1 * | 11/2002 | Bachman | 361/816 |
| 2001/0035931 A1 | 11/2001 | Keiichiro et al. | |

FOREIGN PATENT DOCUMENTS

GB 2 383 472 6/2003

OTHER PUBLICATIONS

IBM Technical Disclosure Bullentin, IBM Corp. New York, US, "Floating Subassemblies With Impact Absorbing Foam", vol. 37, No. 7, Jul. 1, 1994, pp. 187-188.

* cited by examiner

*Primary Examiner*—Jinhee Lee
(74) *Attorney, Agent, or Firm*—Jeffrey W. Wong; Borden Ladner Gervais LLP

(57) ABSTRACT

A spacer for use in a mobile device fills the space between a component assembly and a housing. The spacer includes a layer of compressible material for insertion between the component assembly and the housing. A plurality of compressible features are provided on a face of the layer. Upon insertion of the component assembly and assembly of the housing, the compressible features are compressed to fill a gap between the component assembly and the housing without over-compressing the main body of the spacer, allowing the body of the spacer to cushion any subsequent impact to the mobile device.

7 Claims, 11 Drawing Sheets

FIG. 6
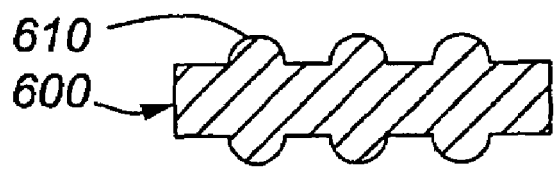
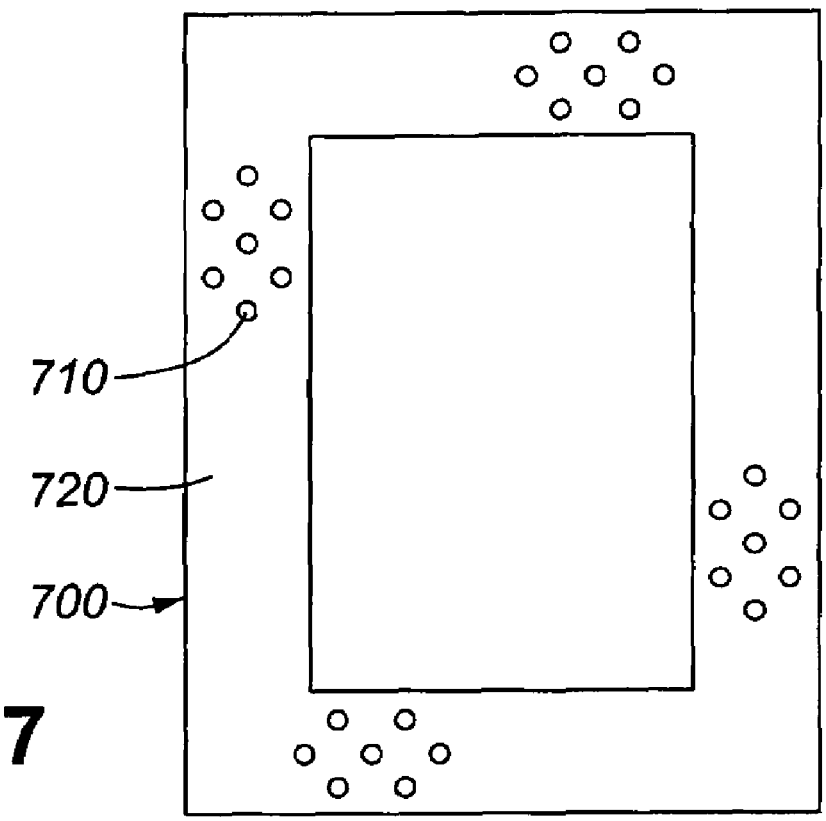
FIG. 7
FIG. 8
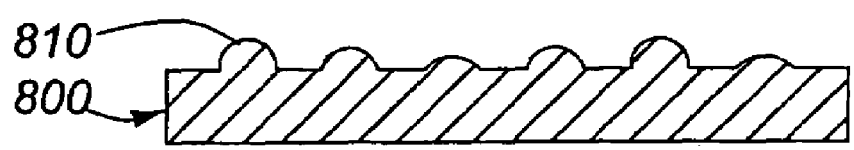

COMPONENT ASSEMBLY CUSHIONING DEVICE FOR MOBILE DEVICES

FIELD OF THE INVENTION

The present invention relates to a mobile devices and particularly, to a device for cushioning a component assembly in a mobile device.

BACKGROUND OF THE INVENTION

Many mobile electronic devices such as hand-held computers, cellular telephones, personal digital assistants (PDAs), have a multi-component assembly housed within a small case or housing. A small housing means that a small change (numerically) in the size of the internal components or the housing can result in a large change (in terms of percentage) in the space within the housing allocated for the component assembly. A typical component assembly is a component stack that includes a display, such as a liquid crystal display (LCD) and a circuit board.

Typically, the housing consists of two mating halves to contain the assembly. The mated halves define an interior cavity and, of course, the depth of the component assembly must be slightly less than the depth of the interior cavity. The difference in depth results in an undesirable gap between the component assembly and the housing inside the assembled device.

The gap can be expected to vary in depth due to manufacturing tolerances, assembly tolerances, substitution of components in the component assembly, redesign of the component assembly or the use of a standard housing for different models or devices.

The gap is undesirable since it can result in movement or play of the interior components of the device allowing components to become displaced, disconnected, damaged or simply rattle around inside the housing, especially if the device suffers a shock such as from being dropped.

To eliminate these undesirable results, one solution is to employ a cushion or spacer, for example, a layer of compressible foam. Initially, the uncompressed spacer is deeper than the dimension of the gap so that when the depth of the spacer is added to the depth of the component assembly, the total depth is greater than that of the interior of the housing. However, during assembly of the housing of the device, the interior of the housing comes into contact with the spacer and compresses it against the component stack. Accordingly, the gap is occupied by the compressed spacer preventing movement of the component assembly in the direction of the stack-up (normal to the plane of the circuit board or the LCD).

If the spacer is insufficiently deep, it will not span the gap even in an uncompressed state or it will provide inadequate cushioning for the component assembly. If the spacer is too deep then upon compression it will exert excessive pressure to the component assembly including the display. In the situation where the display is an LCD module, the LCD itself is sensitive to the pressure applied to it. Pushing it unevenly or with too much force will cause a blemish or distortion to appear in the viewing area. Excessive pressure can also prevent the spacer from properly dispersing the energy of an impact because its ability to deflect has already been used in taking up the tolerance of the small available space and in extreme cases excessive pressure or the inability to deflect a shock can result in breaking of the screen. This is very costly, especially if the screen is an expensive color LCD.

Any of these scenarios can result in an unacceptable product and increase the cost of manufacturing of mobile devices. Accordingly, it is desirable to provide an improved spacer for use with a component assembly to more controllably fill a gap between the component assembly and the housing.

SUMMARY OF THE INVENTION

According to an embodiment, there is provided a spacer for use in a mobile device to space a component assembly from a housing of the mobile device. The spacer comprises a body of compressible material for insertion between the component assembly and the housing; and a plurality of compressible features provided on the body. The compressible features deform to prevent displacement of the component assembly relative to the housing while leaving the body of the spacer relatively uncompressed so that the body cushions the component assembly. The compressible features can be domed, cylindrical, polygonal prism, conical, frusto-conical, pyramidal or frusto-pyramidal in shape.

According to a further embodiment, there is provided a spacer for use in a mobile device. The spacer fills a space between a component assembly and a housing. The component assembly includes a display component. The spacer comprises a layer of compressible material for insertion between the component assembly and the housing; and a plurality of compressible features provided on a face of the layer. The compressible features are compressible upon assembly of the mobile device and extend between the component assembly and the housing to space the component assembly inside the housing when the mobile device is assembled. The depth of the layer and uncompressed compressible features exceeds the depth of the space between the component assembly and the housing, and the depth of the compressed layer and the compressed compressible features exceeds a predetermined critical depth.

In another embodiment, there is provided a method of manufacturing a spacer for use in a mobile device. The spacer includes a body of compressible material for insertion between a component assembly of the mobile device and a housing of the mobile device; and a plurality of compressible features are provided on the body for filling space between the component assembly and the housing during assembly of the mobile device while leaving the body of the spacer relatively uncompressed so that the body can cushion the component assembly. The method comprises steps of depositing partially cured solution of material onto a surface; spreading the partially cured solution of material to form a layer of desired thickness; using a patterned roller to flatten and pattern the spread partially cured solution of material; and allowing the partially cured solution of material to cure.

BRIEF DESCRIPTION OF THE DRAWINGS

Embodiments of the present invention will now be described, by way of example only, with reference to the attached drawings, wherein:

FIG. 6 shows a section view of a further embodiment of the present invention;

FIG. 7 shows a still further embodiment of the present invention;

FIG. 8 is a section view of an additional embodiment of the present invention;

DETAILED DESCRIPTION

Generally, a spacer for use with a mobile device having a component assembly enclosed in a housing is provided. The spacer occupies a gap between the component assembly and the housing.

Figure 1:
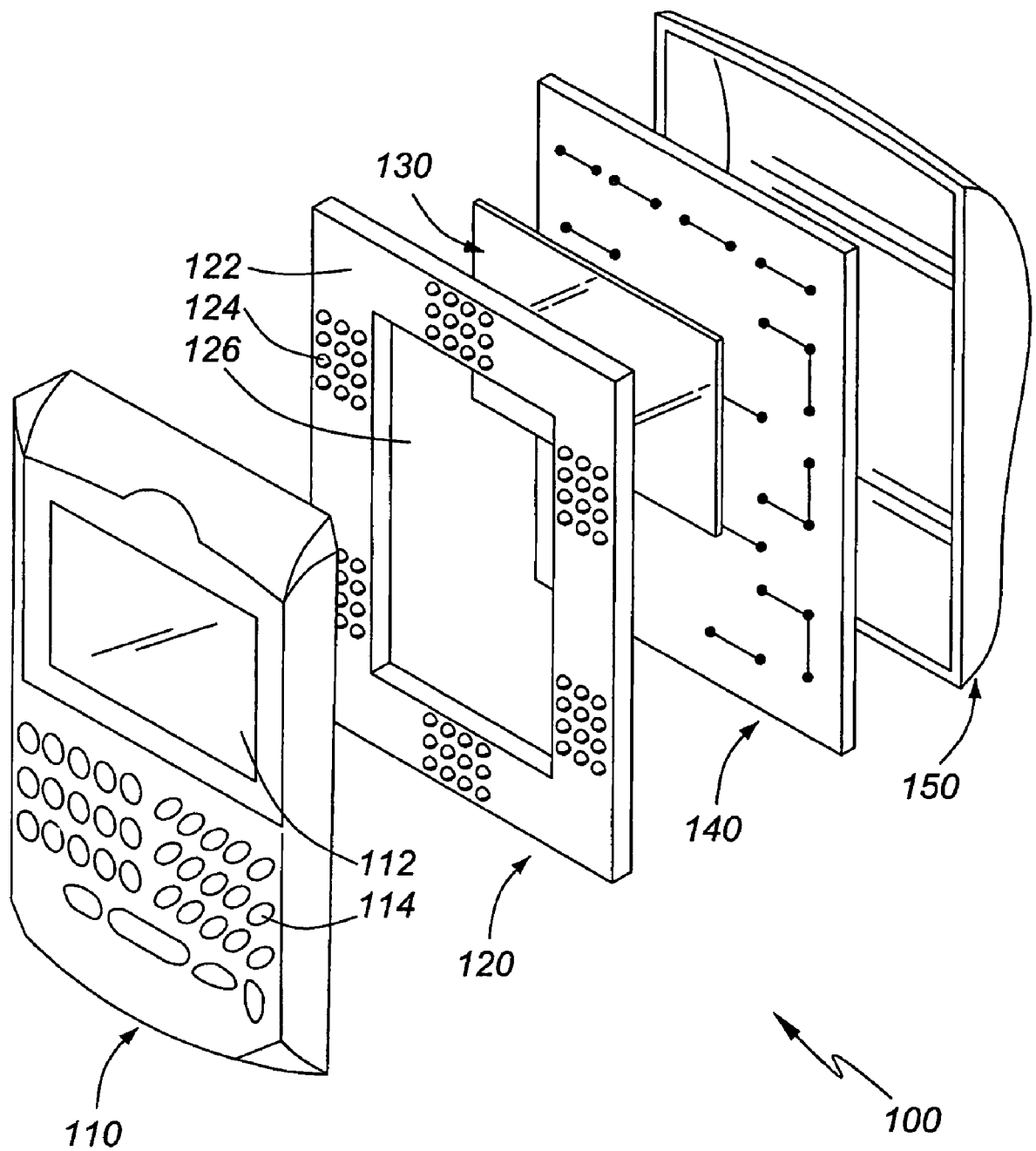
FIG. 1 is an exploded view of a mobile device including a spacer according to an embodiment of the present invention.

Referring to FIG. 1, a mobile device 100 has a component assembly or component stack contained within a housing. The mobile device 100 is an electronic device such as a hand-held computer, a cellular telephone with or without data communications functionality, a wireless mobile data communication device, a wireless email communication device, a pager, or a PDA, for example. The housing of FIG. 1 consists of two mating halves, a front half 110 and a back half 150. When the front and back halves are assembled, they define the housing and an interior cavity. The component assembly includes electronic circuitry 140, for example, a circuit board and a display such as an LCD 130. A seal or spacer 120 according to an embodiment of the present invention is used to eliminate any gap between the housing and the component assembly in the direction of the stack-up (normal to the plane of the circuit board 140).

The spacer 120 is made of a suitable material such as compressible foam. The body 122 of the spacer is a layer dimensioned to extend around the perimeter of the cavity at the front or back half of the housing. A central aperture 126 in the body enables the LCD 130 to be visible through a window 112 in the front of the housing. The central aperture also allows actuators 114 to contact or connect with corresponding elements on the circuit board 140.

Compressible features, such as the raised feature 124, are provided on the front surface of the spacer. These compressible features make the spacer or seal hyperelastic as explained below. The raised features 124 illustrated in FIG. 1 are domed, although they can be any suitable shape such as cylindrical, polygonal prism, conical, frusto-conical, pyramidal and frusto-pyramidal. Alternatively, a pattern of recesses, valleys or dimples can be cut, stamped or otherwise formed into the surface of the spacer, leaving compressible features (e.g. ridges surrounding the cut out portions) formed on the underlying body layer.

According to the present embodiment, the raised features 124 form a regular grid or arrayed pattern, however, any suitable pattern can be used. The planar density of compressible features can also be varied, for example by the pattern chosen, as discussed below.

The raised features 124 can be made of a material different than that of the spacer but, according to a preferred embodiment, they are integrally formed with the spacer. The raised features 124 enable the spacer to accommodate larger gaps than a conventional spacer without over compressing the LCD 130 in smaller gaps.

Figure 9:
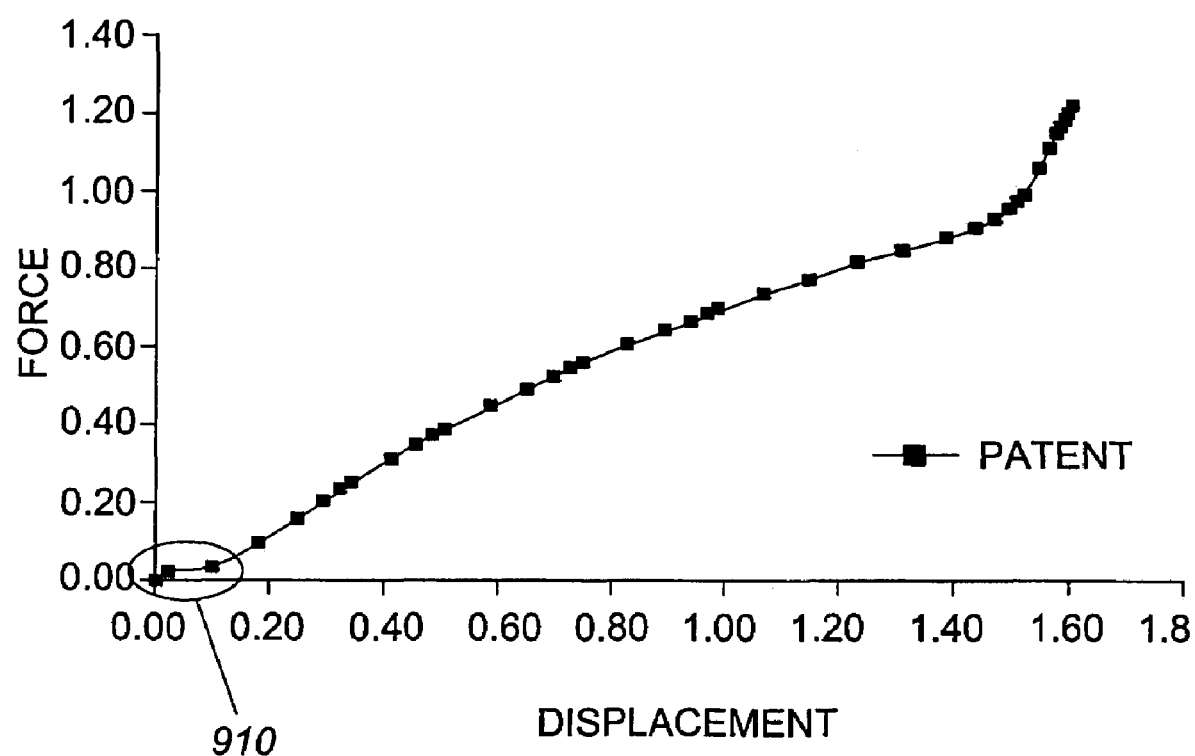
FIG. 9 shows a graph illustrating relationship between force and displacement.

As illustrated in FIG. 9, at the beginning of compression, the raised features 124 deflect with minimal force since the volume of the raised features 124 of the spacer 120 is small. See region 910 in FIG. 9. Without the raised features 124 there could be a gap or inadequate cushioning between the housing and the assembly. The raised features 124 overcome the tolerance or gap without affecting the range of the work area of the spacer 120. This makes the full compression range of at least the body 122 of the spacer 120 available for cushioning the component assembly. The component assembly will have neither pre-compression set nor play.

Figure 11A:
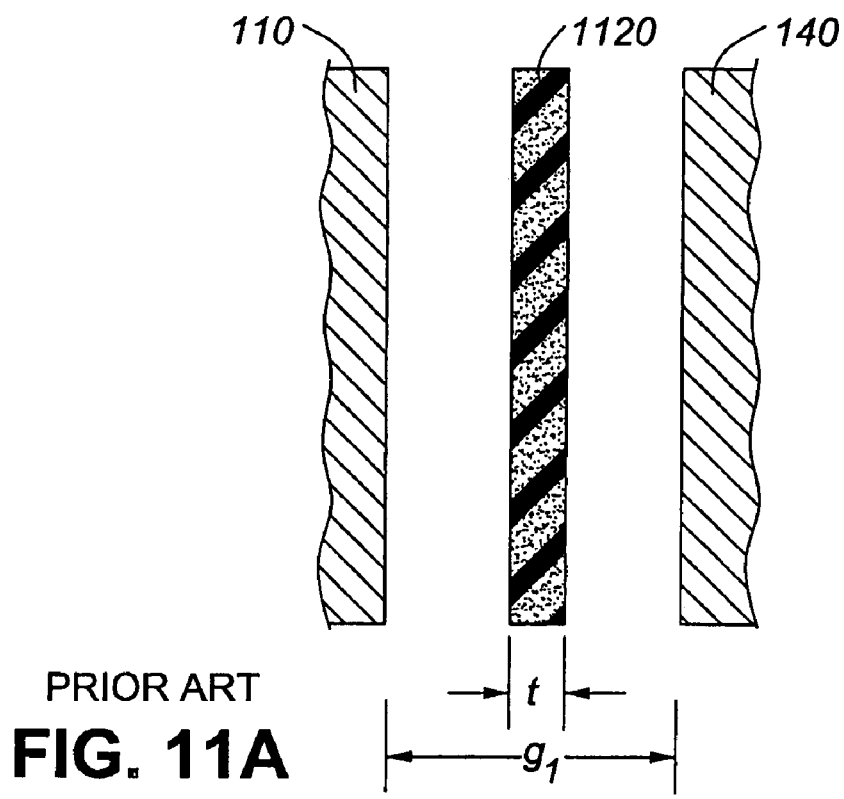
FIGS. 11a and 11b show the range of gaps accommodated by a conventional spacer.
Figure 11B:
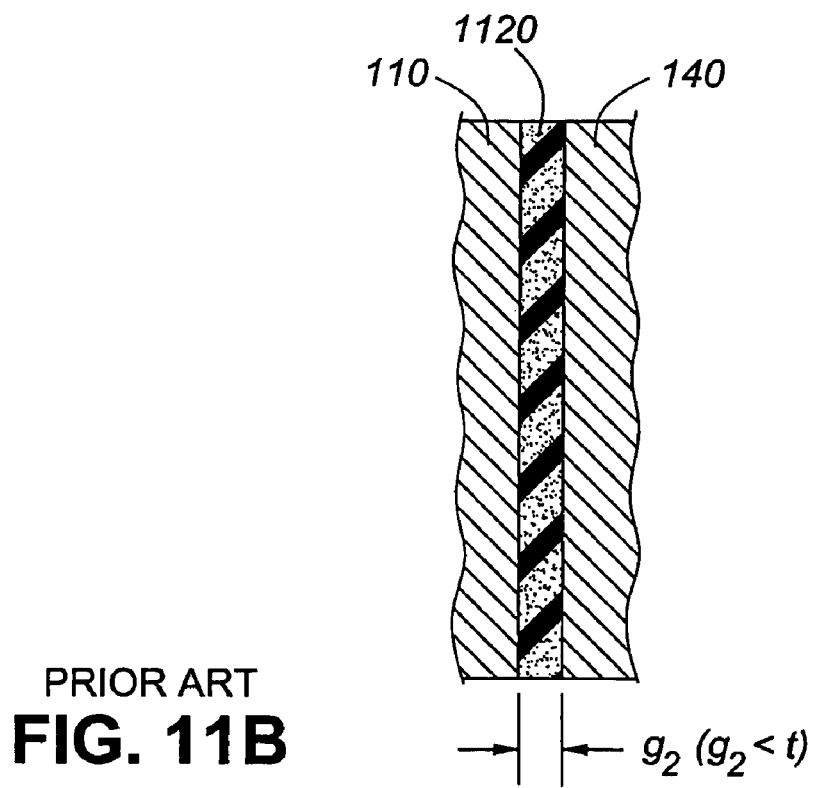

FIG. 11a illustrates a conventional spacer 1120 having thickness t. In this example, an acceptable maximum amount of compression c in the range $0 < c <= 0.10t$, i.e. any amount of compression up to 10 percent of the original thickness of the spacer 1120 does not over compress the spacer and the spacer retains sufficient resilience to absorb a predefined shock. Of course, the range will vary depending on many factors, including the properties of the material of the spacer and the geometry of the spacer, component stack and housing. In the example of FIG. 11a, the spacer 1120 cannot accommodate gap g1 where $g1 > t$. Also the spacer 1120 cannot accommodate too small a gap g2 which overcompresses the spacer. Accordingly, the spacer 1120 can only accommodate gaps smaller than its thickness, i.e. $g < t$, and if the acceptable maximum compression is 10% then the spacer can only accommodate gaps larger than $(1-0.1)t$, or $g > 0.9t$. Accordingly, for a conventional spacer such as the spacer 1120, $0.9t < g < t$, or more generally $(1-c)t < g < t$, where g is the size of the gap, t is the thickness of the spacer and c is the maximum acceptable amount of compression and $0 < c < 1$.

Figure 12A:
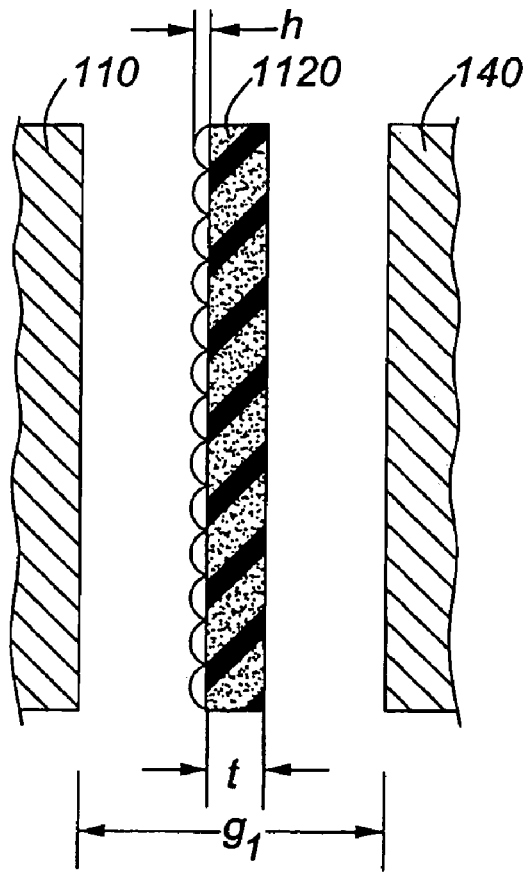
FIGS. 12a and 12b show the range of gaps accommodated by a spacer according to embodiments of the present invention.
Figure 12B:
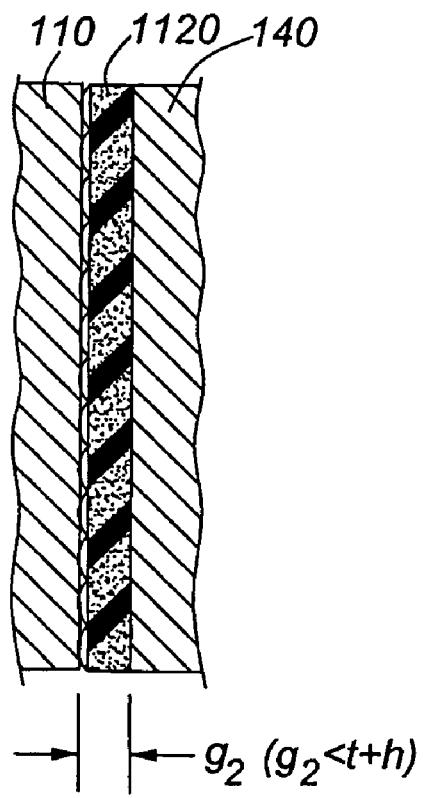
Figure 13A:
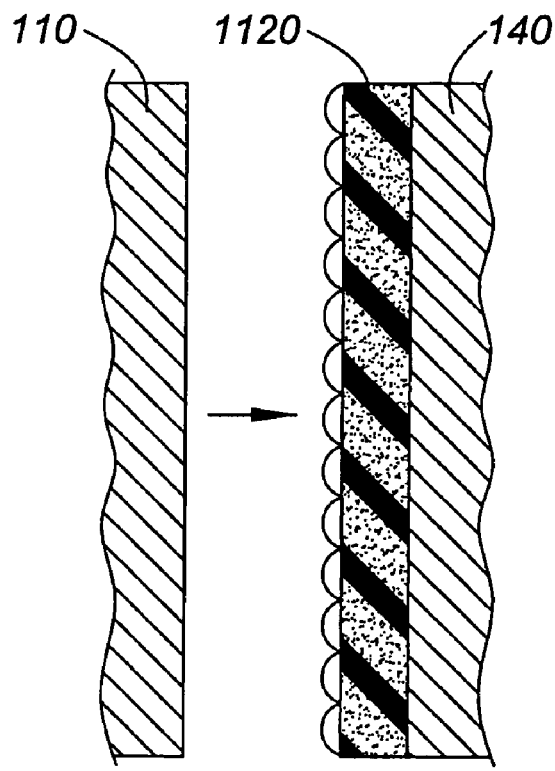
FIGS. 13a, 13b and 13c show the deformation of a spacer in compression.
Figure 13B:
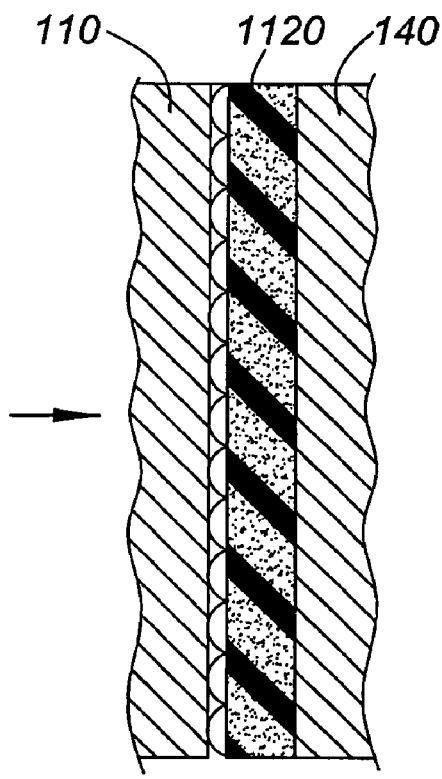
Figure 13C:
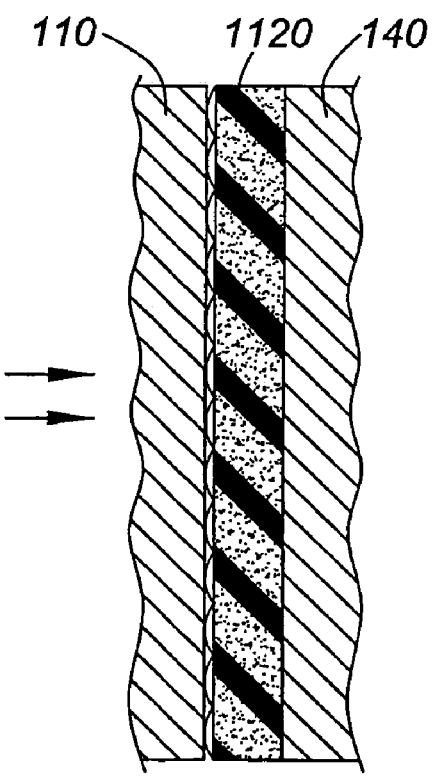

By contrast, referring to FIGS. 12a and 12b, a spacer 1210 according to the present invention includes a main body 1212 with thickness t and protrusions 1214 with thickness h. Assuming that the volume of material in the protrusions is small compared with the volume of material in the body, then the protrusions will be nearly completely collapsed before any substantial compression of the body 1212 occurs, as shown in FIGS. 13a to 13c. When the protrusions are partially compressed, a compression force is exerted on the component stack preventing it from moving in the stack direction. If there are fewer protrusions, then deformation of the main body resulting from pressure on the protrusions is negligible and the full range of compression of the main body 1212 is available to absorb any shock to which the component stack is subjected. Referring to FIGS. 12a and 12b, where the body 1212 of spacer 1210 has the same thickness as body 1120 and the same maximum amount of compression, then any gap which satisfies $g < t+h$ and $g > (1-c)t$ can be accommodated, or $(1-c)t < g < t+h$. Thus, the spacer 1210 accommodates a greater range of gaps, including gaps up to a size of $t+h$ instead of gaps up to size t, without affecting the compression limit c. The ratio of h to t is important, and selected for a desired gap range. For example, the increase in gap range is very significant if $h/t$ is close to 1.

As indicated above, the maximum amount of compression, expressed in terms of the total thickness of the spacer, can vary substantially. According to an embodiment of the present invention, the maximum amount of compression, c, is in the range 3% to 10%. According to another embodiment, c is in the range 4% to 6%. According to a further embodiment c is approximately 5%.

More generally, a spacer according to embodiments of the present invention includes a spacer having a body and layer of compressible features provided on the body. The body and the layer of compressible features have different compression properties. The body is relatively resistant to compression and the layer of compressible features is relatively easy to compress. This arrangement can be effected by using different materials or by using the same materials for differently formed structures or differently dimensioned structures as in the examples above. According to the examples provided above, the body comprises a first layer relatively resistant to compression and the protrusions form a sparse second layer of material that is relatively compressible. Alternatively, the relatively compressible layer is formed of a layer similar to the body layer but having depressions, cut-outs, grooves or other volumes of material removed so that the total volume of material compressed is less than the volume of material compressed in a like volume of space.

Figure 10:
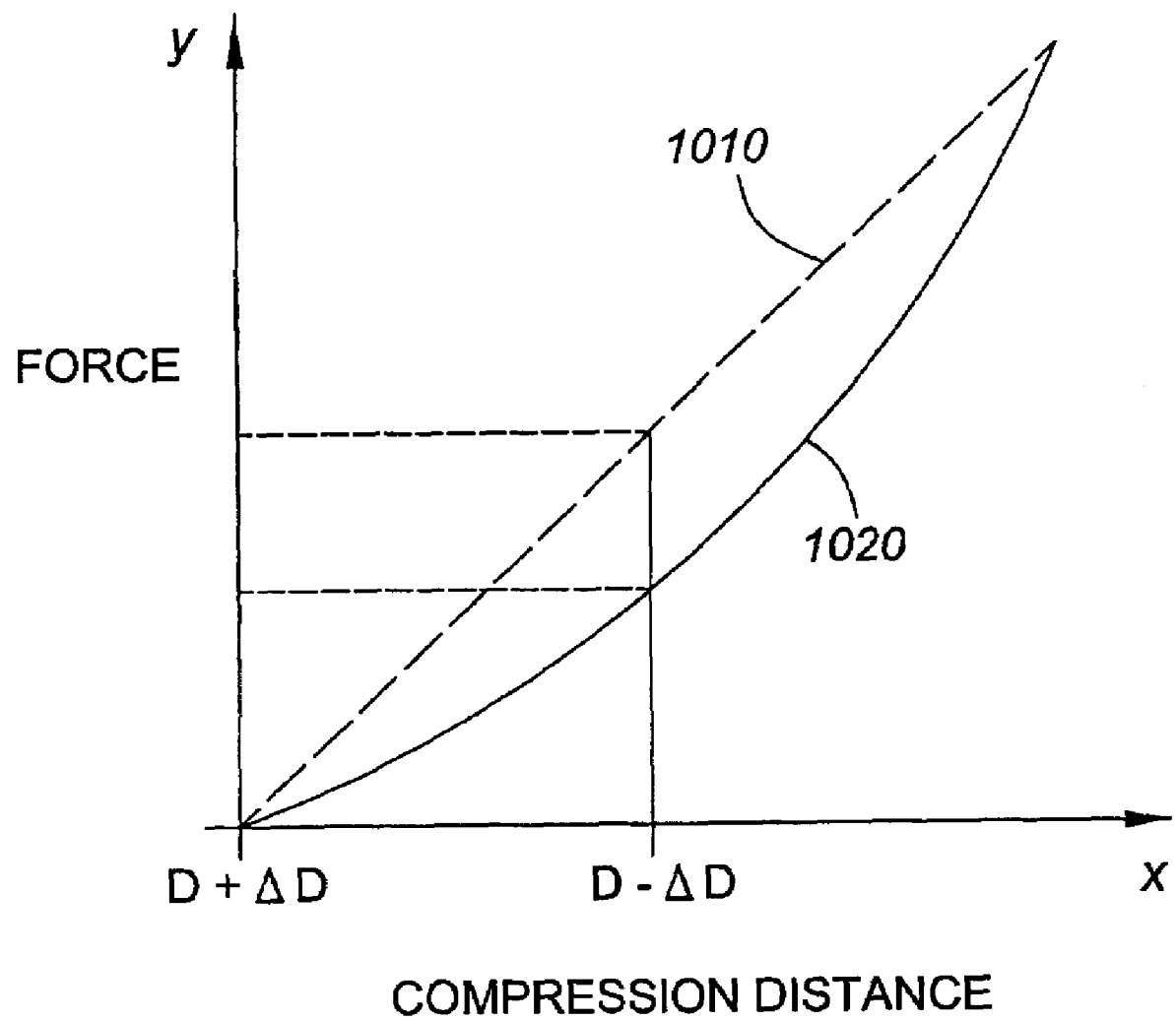
FIG. 10 shows a graph contrasting the compression properties of a spacer according to embodiments of the present invention with those of conventional technology.

Spacers according to aspects of the present invention have different physical characteristics than a conventional spacer. This is illustrated in FIG. 10. A conventional spacer without raised features has the compression curve 1010 whereas a spacer according to an embodiment of the present invention has compression curve 1020.

The compression curves of FIG. 10 illustrate the different amounts of force exerted on the LCD due to the compression of each spacer. It is evident that for a given amount of compression, spacers according to embodiments of the present invention advantageously exert less force on a component stack and, in particular, on an LCD or other sensitive component in the component stack.

Figure 2:
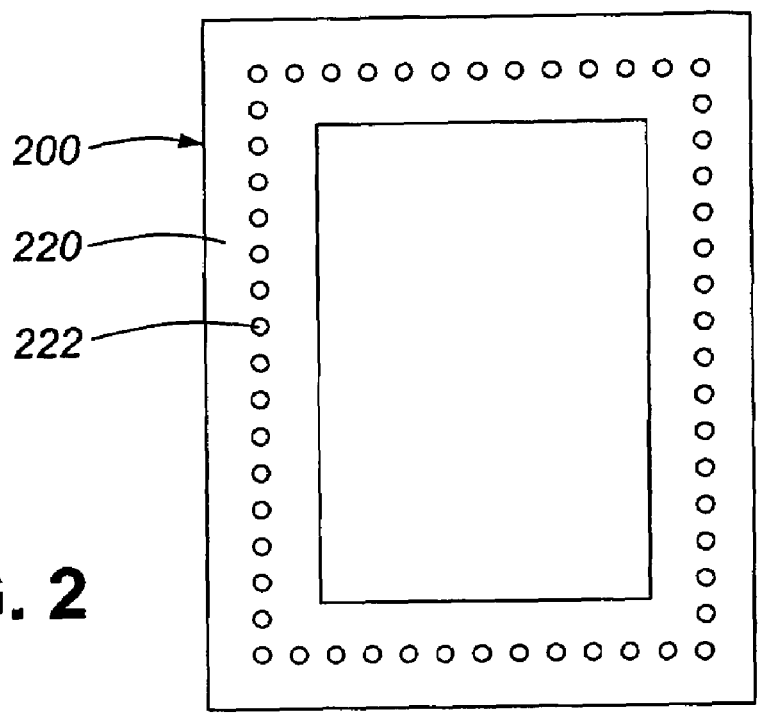
FIG. 2 shows an alternative embodiment of the present invention.
Figure 3:
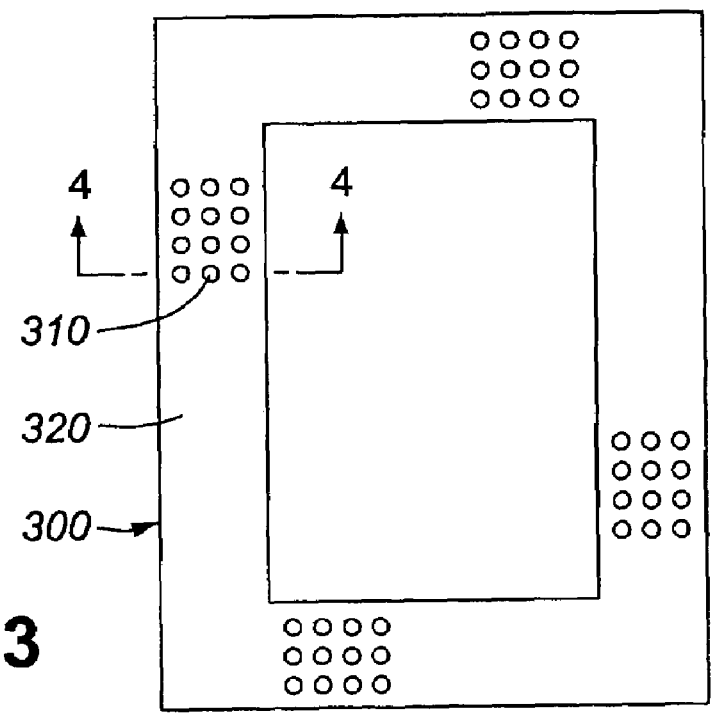
FIG. 3 shows another alternative embodiment of the present invention.
Figure 4:
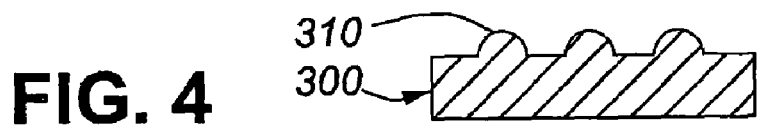
FIG. 4 shows a section view along the line 4-4 of FIG. 3.

FIG. 2 illustrates another embodiment of the present invention, in which a spacer 200 includes a body 220 having raised features 222 that are differently spaced than in the preceding embodiment shown in FIG. 1. FIGS. 3 and 4 illustrate still another embodiment wherein a spacer 300 has a different pattern of raised features 310 on the body 320.

Figure 5:
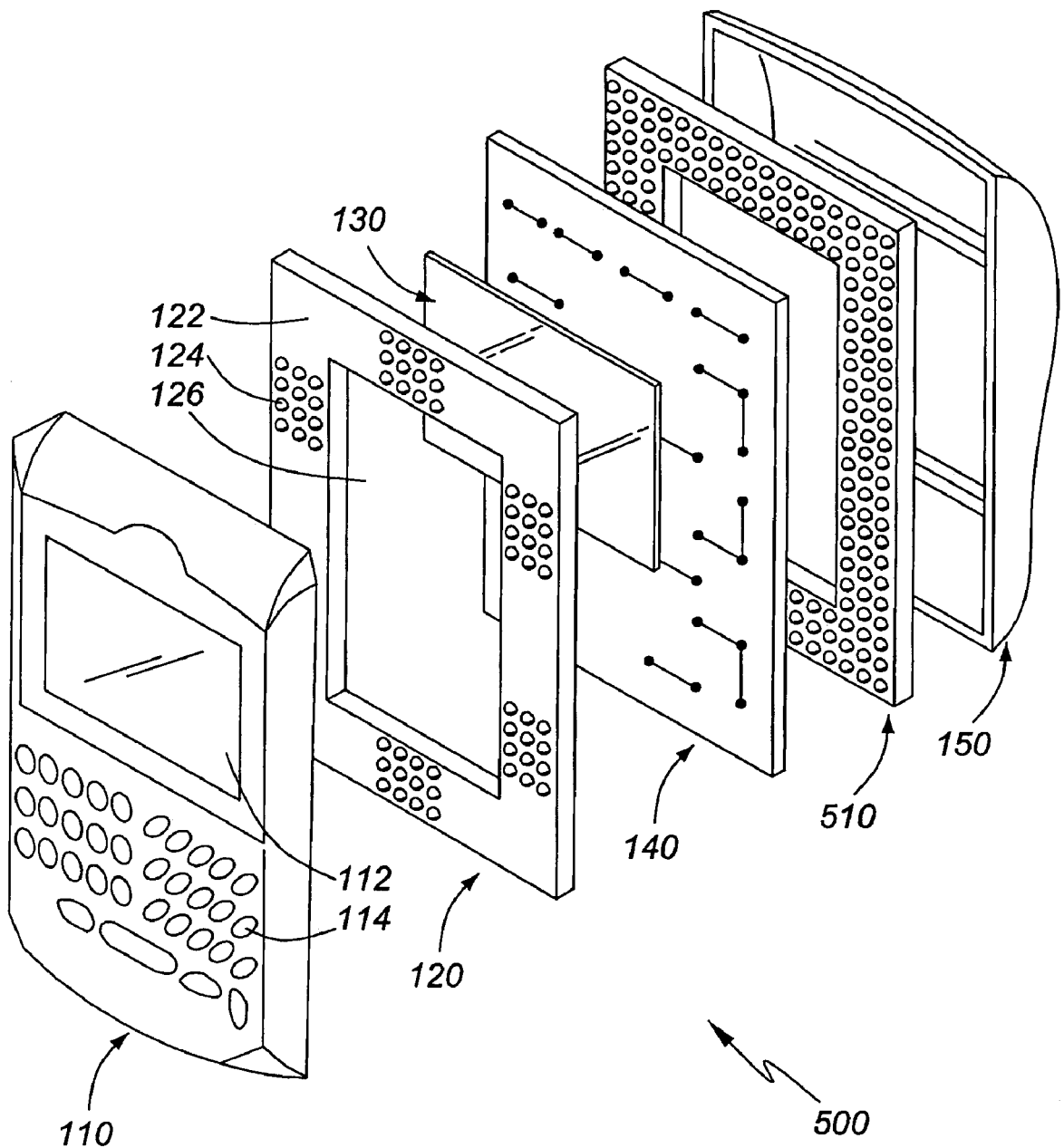
FIG. 5 is an exploded view of a mobile device including two spacers.

According to FIG. 5, an alternative embodiment of the present invention is illustrated in which a front spacer 120 and a back spacer 510 are employed, corresponding to each of the two halves 110 and 150 of the housing. This provides additional protection for the components and enables larger tolerances to be overcome.

According to FIG. 6, the spacer 600 has raised features 610 on both its surfaces. Again, this increases the amount of tolerance which can be accommodated by the spacer.

FIG. 7 illustrates another pattern of raised features 710 which are less densely spaced on the body 720 of the spacer 700 than the raised features of FIG. 1. This decreases the volume of spacer 700 to be compressed and decreases the associated pressure. Alternatively, the pattern of compressible features can be more densely spaced to increase the volume of material initially compressed and increase the pressure.

FIG. 8 illustrates compressible features 810 of varying heights that modify the compression curve of the spacer 800 over its area.

Figure 14A:
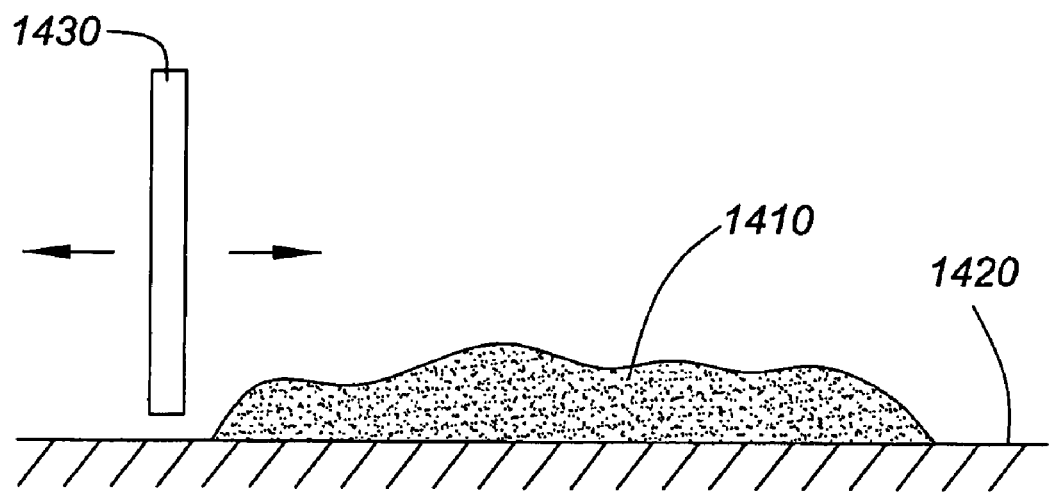
FIGS. 14a, 14b and 14c show the steps in a method of manufacturing a spacer.
Figure 14B:
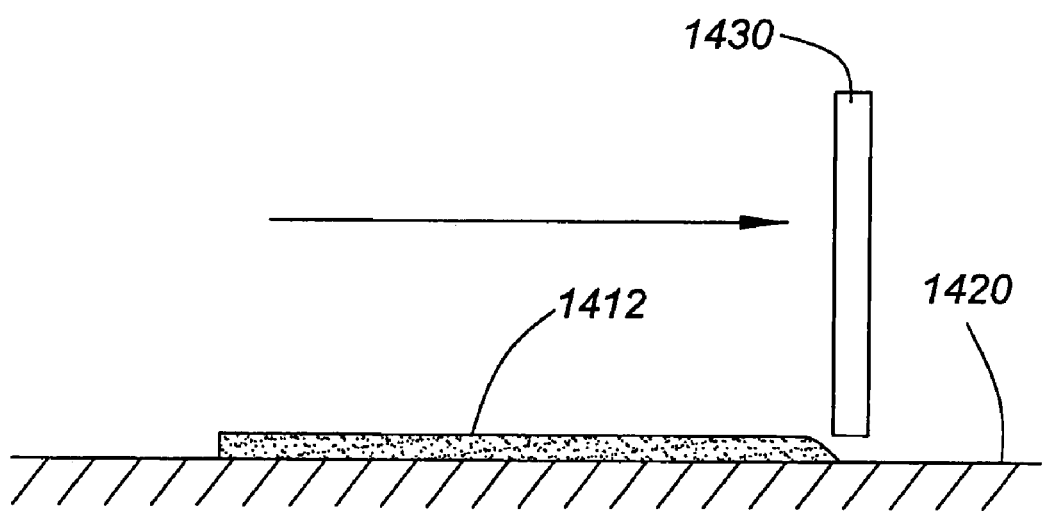
Figure 14C:
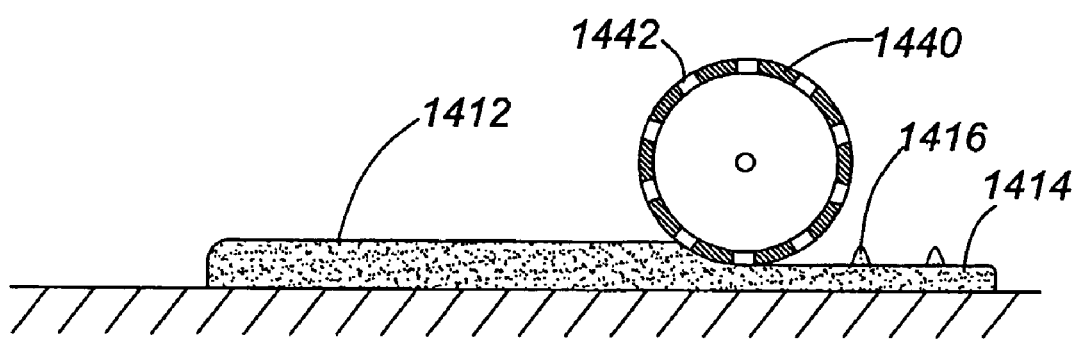
Figure 15:
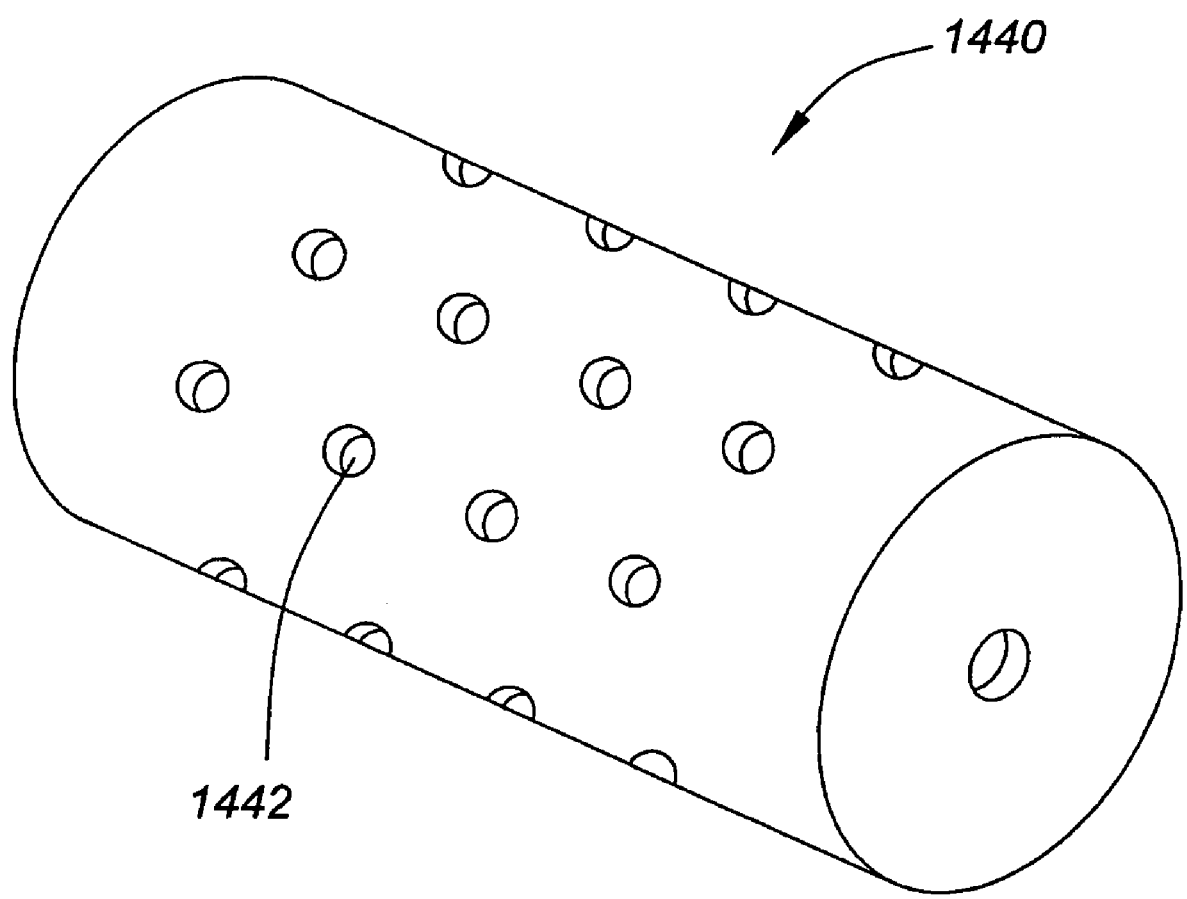
FIG. 15 shows the master roll 1440 of FIG. 14.

An example method of manufacturing the spacer of the present invention is illustrated in FIGS. 14 and 15. Initially, a mass 1410 of liquid solution of rubber or other suitable material is deposited on a plate 1420, as shown in FIG. 14*a*. As the solution cures, an oscillating blade 1430 spreads the rubber solution 1410 over the plate 1420 to achieve a layer of rubber 1412 in a half-liquid state, as in FIG. 14*b*. The layer is approximately twice the thickness of the final spacer, although this can be varied as required. Referring now to FIG. 14*c*, a master roll 1440 is then used to flatten and pattern the rubber 1412 and produce a mass of material 1414 of the desired thickness, for example, 0.787 mm not including the thickness of the raised features 1416. The material is allowed to cure, and is then trimmed to form one or more rolls which can be cut as desired into individual spacers.

FIG. 15 illustrates an example embodiment of a master roll 1440 having indentations 1442 which result in the raised features 1416. Of course, other master rolls are used to produce different shapes or patterns of raised features, or to effect dimples or cut outs in a material roll for spacers.

The above-described embodiments of the present invention are intended to be examples only. Alterations, modifications and variations may be effected to the particular embodiments by those of skill in the art without departing from the scope of the invention, which is defined solely by the claims appended hereto.

The invention claimed is:

1. A spacer for use in a mobile device, the spacer for filling a space between a component assembly and a housing, the component assembly including a display component, the spacer comprising:

a layer of compressible material for insertion between the component assembly and the housing; and a plurality of compressible features integrally formed on a face of the layer, the compressible features being compressible, via volumetric pressure difference, upon assembly of the mobile device and extending between the component assembly and the housing to space the component assembly inside the housing when the mobile device is assembled, and the depth of the layer and uncompressed compressible features exceeding the depth of the space between the component assembly and the housing, and the depth of the compressed layer and the compressed compressible features exceeding a predetermined critical depth;

wherein the compressible material is a compressible foam.

2. The spacer of claim 1, wherein the compressible features are domed, cylindrical, polygonal prism, conical, frusto-conical, pyramidal or frusto-pyramidal in shape.

3. The spacer of claim 1, wherein the compressible features are uniform in depth.

4. The spacer of claim 1, wherein the compressible features are clustered in spaced apart groupings.

5. The spacer of claim 1, wherein the layer is provided with an aperture to expose the display component.

6. The spacer of claim 5, wherein the display component is one of: a liquid crystal display, a plasma display, a light emitting diode display and an organic display.

7. The spacer of claim 1, wherein the compressible features form a grid pattern.

* * * * *